United States Patent [19]

Leak et al.

[11] Patent Number: 5,257,221
[45] Date of Patent: Oct. 26, 1993

[54] APPARATUS FOR SELECTING MUMBER OF WAIT STATES IN A BURST EPROM ARCHITECTURE

[75] Inventors: David A. Leak, Rancho Cordova; Joseph H. Salmon, Placerville; Robert E. Larsen, Shingle Springs, all of Calif.

[73] Assignee: Intel Corporation, Santa Clara, Calif.

[21] Appl. No.: 981,949

[22] Filed: Nov. 25, 1992

Related U.S. Application Data

[63] Continuation of Ser. No. 523,820, May 15, 1990, abandoned.

[51] Int. Cl.⁵ ............................................. G11C 5/00
[52] U.S. Cl. ...................................... 365/53; 365/94; 257/435
[58] Field of Search .................. 365/53, 94, 104, 18.5, 365/218; 257/435

[56] References Cited

U.S. PATENT DOCUMENTS

| | | | |
|---|---|---|---|
| 4,159,050 | 5/1985 | Folmsbee | 365/53 |
| 4,530,074 | 7/1985 | Folsmbee | 365/53 |
| 4,779,229 | 10/1988 | Agrawal | 365/94 |
| 4,805,138 | 2/1989 | McElroy | 365/53 |
| 4,926,385 | 5/1990 | Fujishima et al. | 365/230.08 |

FOREIGN PATENT DOCUMENTS 357333  3/1990  European Pat. Off. .
WO89/02128  3/1989  PCT Int'l Appl. .

Primary Examiner—Joseph A. Popek
Attorney, Agent, or Firm—Blakely, Sokoloff, Taylor & Zafman

[57] ABSTRACT

A mechanism to change the functionality of a state machine used to control operation of an EPROM device. The mechanism is programmed to generate logic level signals which are input to combinatorial logic used to implement the state machine to cause the state machine to operate with a predetermined number of wait states (typically on, two or three wait states) depending on the programming applied to the mechanism. The mechanism utilizes EPROM cells which are covered by a shield so that once programmed, they cannot be erased. The programming is performed after the part has been manufactured, but before shipment to a customer who, upon receipt of the part programs the EPROM in the usual manner. The programmed EPROM can then be erased nd reprogrammed without affecting the programming defining the number of wait states generated during operation of the state machine.

6 Claims, 2 Drawing Sheets

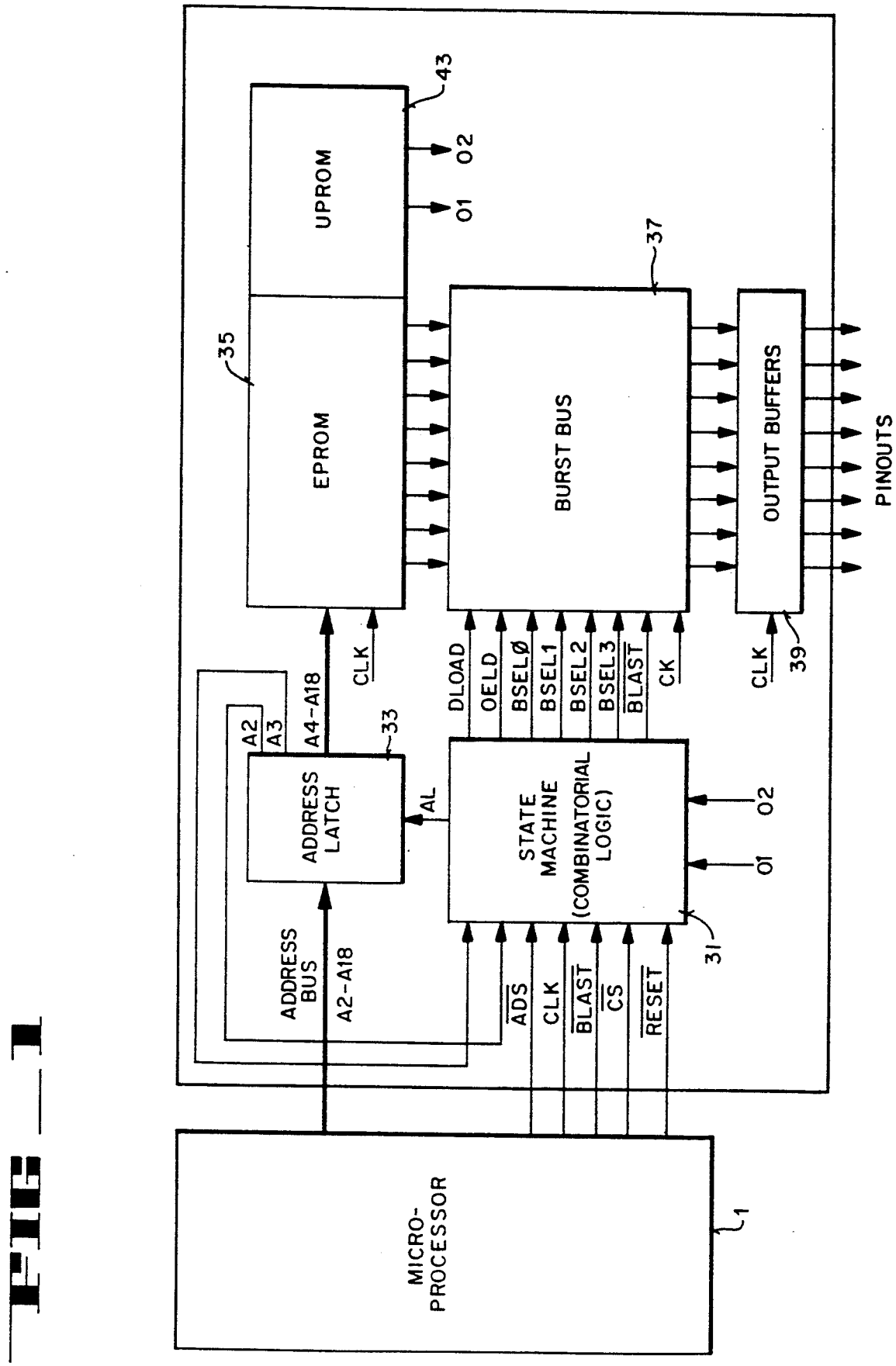
FIG_1

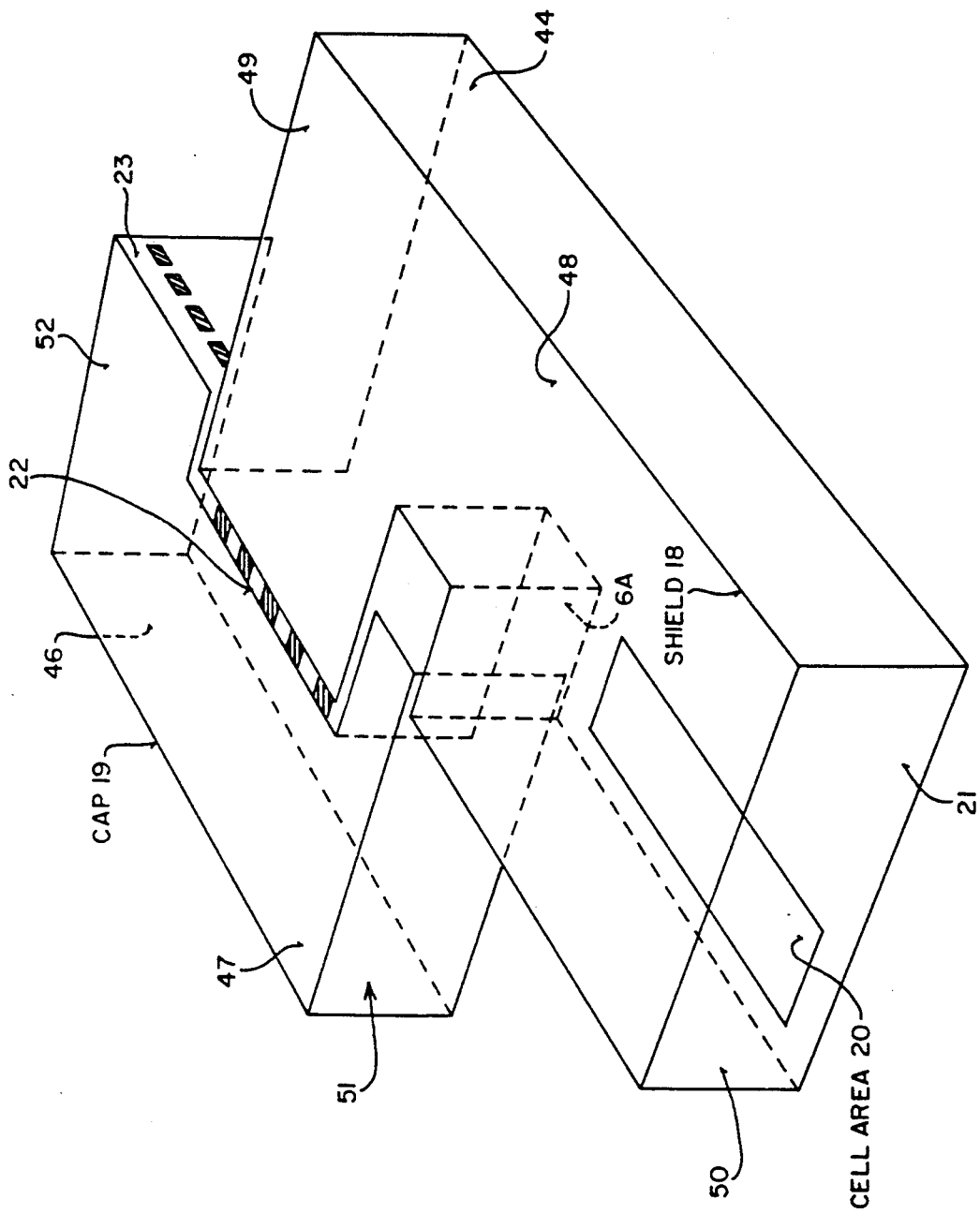
FIG._2

APPARATUS FOR SELECTING MUMBER OF WAIT STATES IN A BURST EPROM ARCHITECTURE

This is a continuation of application Ser. No. 07/5213,820 filed May 15, 1990, now abandoned.

BACKGROUND OF THE INVENTION

EPROMs are memory devices typically programmed by an end user as data or instructions used by a microprocessor to perform a desired function. Presently, most EPROMs are asynchronous devices. However, synchronous EPROM are now available, such as burst EPROMs of the type disclosed in co-pending application Ser. No. 758,141 filed Dec. 28, 1989, now U.S. Pat. No. 5,159,672. To ensure proper operation, the access time of synchronous EPROMs must be compatible with the clock speed and read cycle times of the microprocessor. In this connection, one way to ensure compatibility between a microprocessor and such an EPROM is to provide the EPROM with a number of wait states (i.e., microprocessor clock cycles, typically 0, 1, 2 or 3) between an IDLE state and an initial DOUT (data out) state. For this reason, although two EPROMs may be functionally identical, if used in conjunction with microprocessors having different clock speeds, the two EPROMs must be manufactured so that one incorporates the number of wait states needed for proper operation with one microprocessor, and the other incorporates the number of wait states needed for proper operation with the second microprocessor. For example, the different EPROMs could be manufactured using different metal masks which would produce different numbers of wait states. However, this approach results in a decrease in manufacturing flexibility since to meet customer delivery requirements, EPROMs must be available from an existing inventory of the manufacturer, rather than custom made. Of course, maintaining an inventory of EPROMs which are identical except for the number of wait states increases their cost.

Alternatively, the EPROMs could be manufactured so that the end user could set the number of wait states by, for example, a pin strapping option. However, this approach would increase the number of pinouts, which again results in increased costs.

Another approach commonly used is to require the microprocessor to insert wait states when accessing an attached EPROM as a function of the clock frequency and speed of the EPROM. However, this approach requires that the interface between the microprocessor and EPROM include a mechanism for informing the microprocessor of the speed of the EPROM such as a handshake signal. However, this approach increases the number of pinouts, increases design complexity and may result in a decrease in performance during EPROM accesses.

SUMMARY OF THE INVENTION

The present invention provides a solution to the foregoing problem by using a mechanism which is taught in U.S. Pat. No. 4,530,074, which is owned by the assignee of the present invention, for selecting a redundant column in an EPROM array to replace a defective column by using a shielded EPROM, i.e., an EPROM which can be programmed once, but is not erased when exposed to Uv radiation. However, the present invention uses such mechanism in a manner which is completely different from that taught in the patent.

In essence, the mechanism described in the patent allows certain EPROM cells in an EPROM device to be programmed a single time, while allowing all other EPROM cells in the device to be programmed, erased and reprogrammed as needed in the usual manner. Specific details for such mechanism may be found in the aforesaid patent, and will not be repeated herein except as necessary for a proper understanding of the present invention.

The present invention utilizes the mechanism taught in U.S. Pat. No. 4,530,074 to change the functionality of a state machine used to control operation of an EPROM device. The EPROM device incorporates the mechanism taught in the patent so that the mechanism is programmed to generate logic level signals which are input to combinatorial logic used to implement the state machine to cause the state machine to operate with a predetermined number of wait states (typically one, two or three wait states) depending on the programming applied to the mechanism. This programming is performed after the part has been manufactured, but before shipment to a customer who, upon receipt of the part programs the EPROM in the usual manner. The programmed EPROM can then be erased and reprogrammed without affecting the programming defining the number of wait states generated during operation of the state machine.

FIG. 1 is a block diagram of a burst EPROM which utilizes the present invention.

FIG. 2 is a pictorial view of the mechanism of the present invention.

DETAILED DESCRIPTION OF THE INVENTION

An example, of an EPROM in which the technique of the present invention may be advantageously utilized may be found in the description of a burst EPROM contained in co-pending application Ser. No. 458,141 filed Dec. 28, 1989, owned by the assignee of the present application. In particular, the description contained in the above-mentioned co-pending application discloses an EPROM operating under control of a state machine having a single wait state between an idle state and four data out states. However, by using the present invention, the same basic burst EPROM could be easily configured to operate with one wait state, two wait states, three wait states or more. The following description will assume a one, two or three wait state configuration, which would cover most practical microprocessor/EPROM combinations. However, other configurations should be readily apparent to persons skilled in the field of the invention in view of the description provided herein.

The present invention may be thought of as a one time user programmable read only memory or UPROM. In this connection, referring to FIG. 1 a block diagram is shown of a burst EPROM of the type disclosed in the U.S. Pat. application Ser. No. 458,141 filed Dec. 28, 1989, which operates in combination with a microprocessor 41 comprising a state machine 31, address latch 33, EPROM 35, burst bus 37 and output buffers 39 An additional component not disclosed in the above-referenced application is UPROM 43. In this connection, the various signals and connections shown in FIG. 1 are described in detail in U.S. Pat. application Ser. No. 458,141, and will not be described herein except to the extent necessary for a proper understanding of the invention. UPROM 43 may be programmed in the usual manner of programming EPROM cells by applying a high voltage in conjunction with a program pulse control input to particular address cells in the EPROM, or in this case UPROM 43. The particular programming which would be applied would be to set the outputs of the UPROM 01 and 02 to one of binary 01, 10 or 11 with the initial state, binary 00, being invalid. Further, state machine 31 if implemented using combinatorial logic, by receiving the signals 01 and 02, would generate 1 wait state, between the IDLE state and DOUT0 (the initial data out state) if $01_2$ is received, 2 wait states if $10_2$ is received, and 3 wait states if $11_2$ is received. The specific implementation details of the combinatorial logic used to implement the state machine are not important to an understanding of the invention, would be well within the abilities of a person skilled in the art, and therefore are not disclosed herein.

FIG. 2 shows a pictorial representation of an implementation of UPROM 43 wherein a shield 18 is a continuous structure comprised of a first upper cover 48 and an upstanding member which includes sides 21, 44, 49 and 50. The upstanding member extends down from the first upper cover to make contact with a substrate (not shown). A cap 19 is also a continuous structure comprised of a second upper cover 47 and a second upstanding member which includes sides 46, 51 and 52. The second upstanding member extends down from the second upper cover 47 to make contact with the substrate. Shield 18 and cap 19 form the shielding structure which protects EPROM cells within cell area 20 from radiation. In an actual MOS device, the shield 18 and cap 19 will not have sharp corners as shown in FIG. 2 but will be rounded during the actual fabrication process. It is important to note that the metal sides such as side 21 extend down and make contact with the substrate. This is important to insure that radiation cannot enter through the gate oxide.

Light can only enter the shield through opening 22 or opening 23. Opening 23 defined by cap 19 provides a means for conductors to leave the shielding structure so that the shielded EPROM cells can be connected to other circuitry of the EPROM. This is necessary to program the cells and to later sense the state of the cells. The drain region of each EPROM cell, a common source region and a common select gate must be available for connection to other circuitry. To provide these connections, but minimize the overall width of opening 23, shield 18 is connected to the diffusion which forms the sources of the cells. (The sources of the shielded EPROM cells are common since they are single diffusion). Radiation entering narrow opening 22 is reflected by the substrate to the metal and many reflections occur before the radiation reaches the cell area 20. Such radiation is substantially attenuated and does not significantly erase the shielded EPROM cells.

In order to select each of shielded cells EPROM separately, conductors connected to each terminal of each cell must be available to be connected to other circuitry in the EPROM, specifically state machine 31. The drain of one cell is available to be connected to other circuitry in the EPROM since it is connected to cap 19. The drains of other cells are connected to polysilicon lines through buried contacts Although further specific implementation details may be found in U.S. Pat. No. 4,530,074, for purposes of the present invention, the conductors for two shielded EPROM cells, the polysilicon lines connected to the drains are connected through inverters to decoders that form the lines 01 and 02 which are input to state machine 31. By programming the shielded EPROM cells so that 01 and 02 are $01_2$, $10_2$, or $11_2$, a 1, 2 or 3 wait state burst EPROM is created.

In this manner, an inventory of identical burst EPROM devices can be manufactured and maintained. Then, upon receipt of a customer order for a quantity of burst EPROM devices, that quantity could be removed from inventory and quickly programmed in accordance with the customer's specifications to provide 1, 2 or 3 wait states or any combination thereof. In this connection, since such programming can be performed relatively quickly as compared to prior art techniques for providing such multiple wait states capability, the burst EPROM with the programmed UPROMs could be delivered to the customer relatively quickly and at lower cost than would be possible using prior art techniques.

Once the customer obtained possession of the burst EPROMS with UPROM programmed wait states, the customer could utilize the usual program, erase (for example, exposure to UV radiation), reprogram cycle without destroying the programming in the UPROM.

U.S. Pat. No. 4,530,074 describes other uses for the invention disclosed therein in addition to disabling defective elements and enabling equivalent redundant elements, such as allowing a user to set an EPROM so that it is selected when the chip select pin of the EPROM is in the high state, or when the chip select pin of the EPROM is in the low state. The patent also notes that the shielded EPROM cell described in the patent can provide a user with the option of enabling or disabling a particular function by utilizing the one time programming capability described therein. However, such teachings differ from the teachings of the present invention in that the present invention is directed to mechanism which alters the function of a state machine and changes the external performance of an integrated circuit, specifically an EPROM device. More specifically, while the patent and the present invention broadly disclose one-time programming capability, there is no suggestion in the patent that such capability may be employed as described herein. In particular, the present invention utilizes the mechanism described in U.S. Pat. No. 4,530,074 to change the functionality of a state machine, which in turn changes the performance of an EPROM circuit. This is to be contrasted with the uses described in U.S. Pat. No. 4,530,074 which are limited to enabling or disabling redundant elements, or, more generically, enabling or disabling a particular function performed by an integrated circuit. The present invention, rather than enabling or disabling a particular function, actually changes the functionality of a component, and in particular changes the operation of a state machine which, in the prior art, once implemented in combinatorial logic, cannot be changed after the manufacturing process has been completed and the integrated circuit placed into its packaging.

We claim:

1. In a MOS integrated EPROM circuit which is fabricated on a substrate and which contains radiation sensitive areas, a shielding structure for protecting at least two EPROM cells from radiation, comprising:
   a first upper cover disposed above said at least two EPROM cells;

a first upstanding member disposed about said at least two EPROM cells and extending from said substrate to said first upper cover, said first upstanding member defining a first opening above said substrate so as to allow the passage of conductors from said at least two EPROM cells;

said conductors coupled to combinatorial logic of a state machine used to control the EPROM circuit, said state machine generating a predetermined number of wait states based upon programming of said at least two EPROM cells, wherein the wait states generated by the state machine enable the EPROM circuit to have an access time compatible with a clock speed and read cycle times of a microprocessor utilizing said EPROM circuit;

whereby said at least two EPROM cells are protected from radiation when said integrated circuit is exposed to radiation for erasing EPROM cells outside said shielding structure.

2. The shielding structure defined in claim 1 including:

a second upper cover spaced-apart from said first upper cover and said first upstanding member, said second upper cover extending along and beyond said first opening; and a second upstanding member spaced apart from said first upper cover and said first upstanding member, said second upstanding member disposed about and beyond said first opening and extending from said substrate to said second upper cover so as to form a radiation inhibiting cap for said first opening, said second upstanding member defining a second opening above said substrate for allowing said conductors from said at least two EPROM cells to pass from said shielding structure.

3. The shielding structure of claim 2 wherein said first upper cover and said first upstanding member are a first continuous structure.

4. The shielding structure of claim 3 wherein said second upper cover and said second upstanding member are a second continuous structure.

5. The shielding structure of claim 1 wherein said certain area is comprised of a plurality of cells having a floating gate for storing a charge.

6. In a MOS EPROM which is fabricated on a substrate, a shielding structure for protecting a plurality of EPROM cells which are erased when exposed to radiation comprising:

a first continuous metal structure disposed about and above said EPROM cells defining a first opening above the substrate to allow conductors from said EPROM cells to pass from said first structure, said conductors coupled to combinatorial logic of a state machine used to control the EPROM circuit, said state machine generating a predetermined number of wait states based upon programming of said plurality of EPROM cells, wherein the wait states generated by the state machine enable the EPROM circuit to have an access time compatible with a clock speed and read cycle times of a microprocessor utilizing said EPROM circuit;

said first structure fabricated so as to require radiation entering said first opening to traverse at least two angles of approximately 90 degrees before reaching said EPROM cells wherein one terminal of each of said EPROM cells is fabricated from a common diffusion which in turn is connected to said first structure; and a second continuous metal structure spaced apart from said first structure and disposed about and beyond said first opening defining a second opening above the substrate to allow said conductors from said EPROM cells to pass from said second structure, said second opening to be approximately parallel to one side of said second structure so that said side reflects radiation back through said second opening, said second structure to be lubricated so as to require radiation entering said second opening to traverse at least one angle of approximately 90 degrees before reaching said first opening, wherein one terminal of one of said EPROM cells is connected to said second structure;

whereby said EPROM cells are protected from radiation when said mos EPROM is exposed to radiation for erasing EPROM cells outside said shielding structure.

* * * * *

UNITED STATES PATENT AND TRADEMARK OFFICE
CERTIFICATE OF CORRECTION

PATENT NO. : 5,257,221
DATED : October 26, 1993
INVENTOR(S) : Leak, et. al.

It is certified that error appears in the above-indentified patent and that said Letters Patent is hereby corrected as shown below:

Title page, item [54] and col. 1, line 1, delete "MUMBER" and insert-- NUMBER--.

Signed and Sealed this

Twenty-ninth Day of July, 1997

Attest:

BRUCE LEHMAN

*Attesting Officer*  *Commissioner of Patents and Trademarks*